United States Patent [19]
Bernier

[11] Patent Number: 5,998,813
[45] Date of Patent: Dec. 7, 1999

[54] COMPONENT FOR PROTECTING TELEPHONE LINE INTERFACES

[75] Inventor: Eric Bernier, Mettray, France

[73] Assignee: SGS-Thomson Microelectronics S.A., Saint Genis, France

[21] Appl. No.: 08/780,723

[22] Filed: Jan. 8, 1997

[30] Foreign Application Priority Data

Jan. 19, 1996 [FR] France ................................. 96 00811

[51] Int. Cl.$^6$ ........................... H01L 29/74; H01L 31/111
[52] U.S. Cl. ..................... 257/175; 257/126; 257/130; 257/173; 257/544; 361/119
[58] Field of Search ............................. 257/126, 130, 257/146, 155, 173, 175, 544, 551; 438/133; 361/56, 91, 119

[56] References Cited

U.S. PATENT DOCUMENTS

| | | | |
|---|---|---|---|
| 4,021,837 | 5/1977 | Hutson | 357/37 |
| 4,633,289 | 12/1986 | Yuan-Tai Chen | 357/42 |
| 5,072,273 | 12/1991 | Avery | 357/38 |
| 5,420,045 | 5/1995 | Schulze et al. | 437/6 |

FOREIGN PATENT DOCUMENTS 0 687 051  12/1995  European Pat. Off. ......... H02H 9/02

OTHER PUBLICATIONS

French Search Report from French Patent Application 96 00811, filed Jan. 19, 1996.

*Primary Examiner*—Mahshid Saadat
*Assistant Examiner*—George C. Eckert II
*Attorney, Agent, or Firm*—Wolf, Greenfield & Sacks, P.C.

[57] ABSTRACT

A monolithic component for protection against over-currents liable to occur on a line in series with which is connected a detection resistor, comprises a first cathode-gate thyristor associated with an avalanche diode and a second anode-gate thyristor of the gate triggering type or forward breakover type, its breakover voltage being substantially equal to the avalanche voltage of the avalanche diode.

18 Claims, 2 Drawing Sheets

COMPONENT FOR PROTECTING TELEPHONE LINE INTERFACES

BACKGROUND OF THE INVENTION

1. Field of the Invention

The present invention relates to a protection component, and more particularly to a protection component designed to protect telephone lines.

2. Discussion of the Related Art

European patent application EP-A-0,687,051 filed by the applicant describes a circuit for protecting a telephone line interface and specific embodiments of the circuit in the form of a monolithic component. FIG. 1 of the present patent application is a copy of FIG. 4 of the above-mentioned application and represents an element of the circuit including two head-to-tail connected thyristors Th1 and Th2, respectively having a cathode gate and an anode gate. Thyristors Th1 and Th2 are connected between a line AB and a reference terminal G. The gates are interconnected to point B. A common terminal of thyristors Th1 and Th2 is connected to point A, a resistor Rd being connected between points A and B. The other common terminal of thyristors Th1 and Th2 is connected to the reference terminal G. A Zener diode Z1 connected between terminals B and G causes, when avalanching, thyristor Th1 to trigger. A Zener diode Z2 connected between terminals A and G causes, when avalanching, thyristor Th2 to trigger. When the current between terminals A and B exceeds a predetermined threshold, either one of thyristors Th1 and Th2 is triggered by its gate.

Thus, in the circuits of FIG. 1, depending on its biasing, either one of thyristors Th1 and Th2 becomes conductive if the current in resistor Rd exceeds a predetermined threshold or if the voltage on line AB exceeds the avalanche voltage of diode Z1 or Z2.

FIG. 2 of the present patent application is a copy of FIG. 7 of the afore-mentioned application and constitutes an embodiment of the circuit of FIG. 1. An indication of the locations of elements Th1, Th2, Z1 and Z2 of FIG. 1 has been added in FIG. 2.

When designing and realizing the invention related to the afore-mentioned application, the applicant noted that one of the main difficulties to be solved was to obtain similar sensitivities for the gate triggering of thyristors Th1 and Th2 and to obtain suitable hold currents. Thus, various means were indicated in the afore-mentioned application to solve this problem.

However, during the implementation of the circuit, the applicant noted that, although the triggering of thyristor Th1 due to the avalanching of the Zener diode Z1 raises no particular problem, the sensitivity of the triggering of thyristor Th2 due to the flow of current through resistor Rd should be further improved. More particularly, the triggering was too slow (duration longer than 1 μs). Efforts of optimizing the location of the component (see FIGS. 8A–8B of European patent application 0,687,051) have been unsuccessful. Thus, when an overcurrent with a particularly sharp edge (for example, a standardized wave 0.5/700 μs of a 30-A intensity) occurs on line AB, the thyristor Th2 becomes conductive after a slight delay and, during this delay, the protection component transmits the 30-A peak current, which can damage the integrated circuit that is to be protected.

SUMMARY OF THE INVENTION

An object of the present invention is to solve the above problem and to improve the reaction speed of the component further to the occurrence of a positive overcurrent on line AB.

To achieve this object, the applicant has totally modified the structure of the component of FIG. 2 and more particularly the portion of the component corresponding to thyristor Th2, as disclosed hereinafter. With the modification according to the present invention, a very fast triggering of thyristor Th2 at the occurrence of an overcurrent is obtained (shorter than 1 μs after the beginning of the overcurrent).

An illustrative embodiment of the present invention that achieves these objects is a monolithic component that protects against overcurrents liable to occur on a line that is series connected to a detection resistor. The component is formed in a substrate of a first conductivity type having an upper surface and a lower surface and includes first, second and third metallizations, a first cathode-gate thyristor, a second anode-gate thyristor, and an avalanche diode. The first and second metallizations, on the upper surface of the substrate, connect to respective terminals of the detection resistor, and the third metallization, on the lower surface of the substrate, connects to a reference voltage. The first cathode-gate thyristor and the second anode-gate thyristor are head-to-tail connected between the first and third metallizations, the second metallization corresponding to gates of the first and second thyristors. The avalanche diode is connected between the second and third metallizations so that its avalanching causes the first thyristor to be forward conductive. The second thyristor is of a gate triggering type or of a forward breakover type, the breakover voltage of the second thyristor being substantially equal to an avalanche voltage of the avalanche diode, and the first thyristor is laterally insulated by a diffusion wall of a second conductivity type.

BRIEF DESCRIPTION OF THE DRAWINGS

The foregoing and other objects, features, aspects and advantages of the invention will become apparent from the following detailed description of a preferred, non-limiting embodiment of the present invention described by way of example with reference to the accompanying drawings, in which.

As conventionally represented in the field of semiconductor components, cross-sectional views of the components are not drawn to scale, horizontally or vertically. To select the size of the components, those skilled in the art will refer to the conventional art and to the content of the aforementioned patent.

Figure 1:
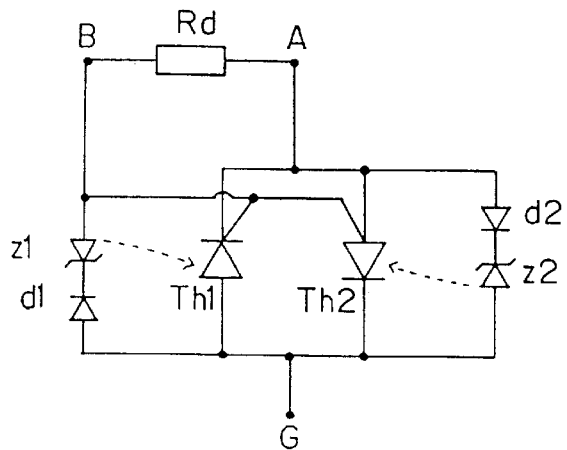
FIG. 1 is a circuit for protecting a telephone line interface and corresponds to FIG. 4 of European patent application EP-A-0,687,051.
Figure 2:
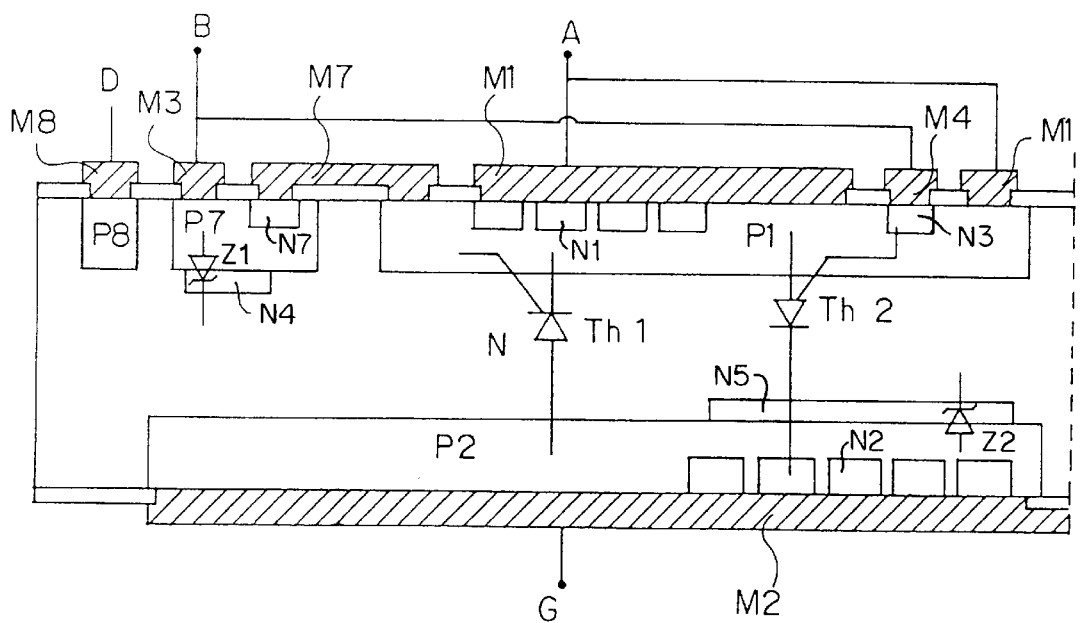
FIG. 2 is a cross-sectional view of the circuit of FIG. 1 and corresponds to FIG. 7 of European patent application EP-A-0,687,051.
Figure 3:
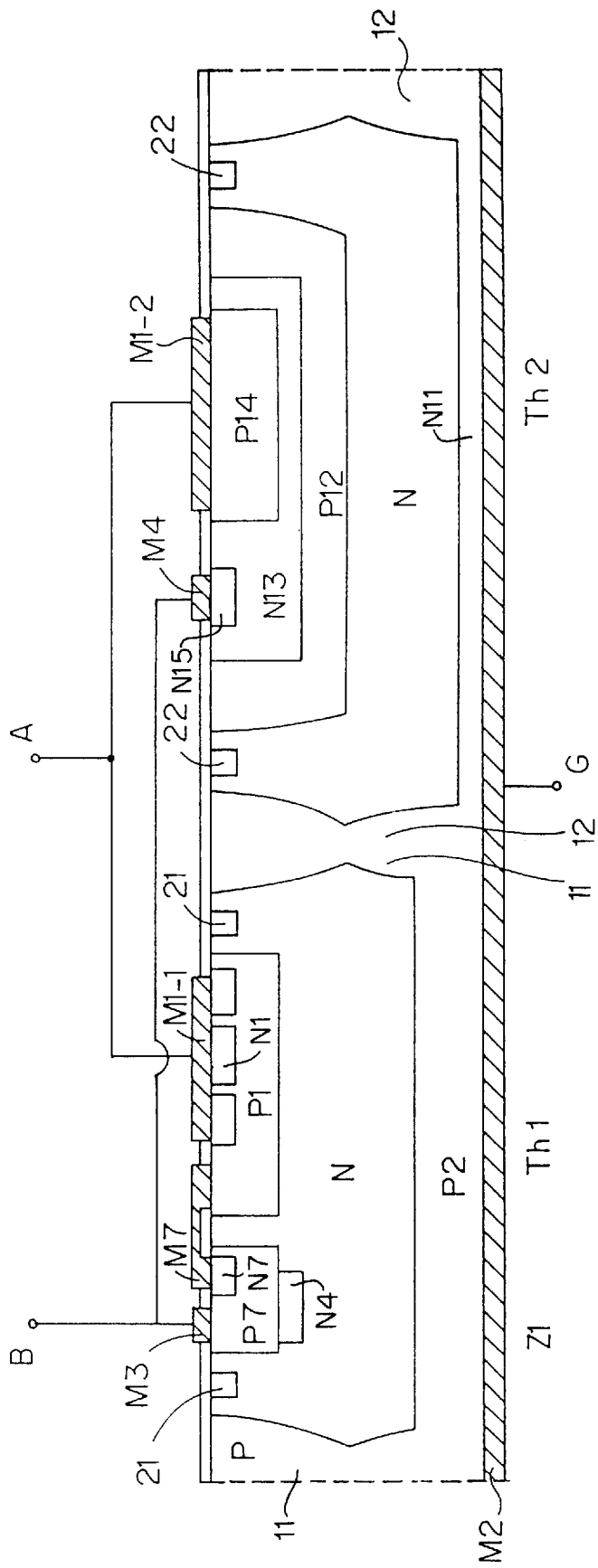
FIG. 3 represents an exemplary integration of a modification of the structure of FIG. 1 according to an embodiment of the invention.

FIG. 3 very schematically represents an exemplary monolithic embodiment of a modification of the circuit of FIG. 1 according to the invention. The component is fabricated like that of FIG. 2 from an N-type substrate. On the left-hand portion of the component are located the same elements as those represented in the left-hand portion of FIG. 2, which are designated with the same references.

One difference with respect to the circuit of FIG. 2 is that the set of layers and semiconductor regions is formed in a well insulated by deep P-type diffusion walls 11 to insulate thyristor Th1 and its associated components from thyristor Th2. The walls are conventionally formed from the upper and lower surfaces of the substrate. In addition, in FIG. 3, the region P8 illustrated in FIG. 2 and used for detecting short-circuits is not represented but can of course be provided, if desired. Thus, the left-hand portion of FIG. 3 includes, on the lower surface of the substrate, a P-type layer P2 and, on the upper surface of the substrate, P-type regions P1 and P7 in which are respectively formed N-type regions N1 and N7. An N-type region N4 is formed at the interface between region P7 and substrate N.

The lower surface of the wafer is coated with a metallization M2. Region P7 is coated with a metallization M3. Region N7 and a portion of region P1 are coated with a metallization M7. Region N1 is coated with a metallization M1-1 which corresponds to a portion of the metallization M1 of FIG. 2.

As described in the afore-mentioned application, this structure implements thyristor Th1 and Zener diode Z1 of FIG. 1. Thyristor Th1 includes regions N1-P1-N-P2 and is associated with regions N7 and P7 to form a gate-amplification thyristor. The Zener diode Z1 is formed by the junction between regions P7 and N4, the junction being especially designed to ensure this function.

The right-hand portion of FIG. 3 represents an embodiment of the elements corresponding to thyristor Th2 and Zener diode Z2 of FIG. 1. As will be noted hereinafter, thyristor Th2 does not differ from diode Z2, since diode Z2 corresponds to one of the junctions of the thyristor Th2 which is in fact a forward breakover triggering thyristor. This structure may be formed in a well insulated by P-type vertical diffusion walls 12.

In the right-hand portion, the lower surface is occupied by a highly doped N-type layer N11 formed by diffusion or implantation-diffusion. On the upper surface, are successively formed a deep P-type diffusion P12; an N-type deep diffusion N13 in region P12 and; in region N13, non-overlapping P-type region P14 and N-type region N15.

Thyristor Th2, from its anode to its cathode, corresponds to the regions and layers P14-N13-P12-N-N11. Region N15 is an anode-gate contact region. The anode region P14 is coated with a metallization M1-2 connected to metallization M1-1. The anode-gate contact region N15 is coated with a metallization M4 corresponding to the metallization having the same reference in FIG. 2 and is connected to terminal B.

In this structure, when thyristor Th2 is forward biased, the junction liable to avalanche is junction N13-P12. It is therefore this junction which should be optimized to have a desired triggering threshold, preferably close to the one of junction P7-N4. Since regions P12 and N13 are formed by successive diffusions, it is possible to optimize the doping levels and the diffusion patterns so that the junction has the desired characteristics.

Likewise, considering that thyristor Th2 is formed by an assembly of PNP transistor P14-N13-P12 and NPN transistor N13-P12-N-N11, the gains of these transistors can be optimized to increase the sensitivity of thyristor Th2, according to the object of the invention.

The fabrication of such a component does not require any additional fabrication steps with respect to the fabrication of the component of FIG. 2 (taking into account that, although no insulation wall is represented in the partial view of FIG. 2, insulation walls may be provided elsewhere in the structure of which the component of FIG. 2 is an elementary component). More particularly, region P12 can be fabricated simultaneously with the upper portion of the insulation walls 11 and 12, region N13 simultaneously with region N4, region P14 simultaneously with regions P1 and P7 and region N15 simultaneously with regions N1, N7 and N11. However, although they result from the same diffusion steps, i.e., with the same annealing duration and temperature, these diffusions can result from implantations at different doses. In particular, the doping level of region P12 is significantly smaller than that of the insulation walls.

By way of example of numeric values, the following values of surface concentrations Cs (atoms/cm$^3$) and of junction depth xj ($\mu$m) can be selected for the various regions.

|  | Cs | xj |
| --- | --- | --- |
| P layer 14 | a few $10^{18}$ | 20 |
| N layer 15 | a few $10^{20}$ | 10 |
| N layer 13 | a few $10^{17}$ | 40 |
| P layer 12 | a few $10^{16}$ | 90 |
| N layer 11 | a few $10^{20}$ | 10 |

Additionally, to avoid parasitic triggering, stop-channel rings are preferentially formed at the internal periphery of each wall 11, 12 (and at least of wall 11). The stop-channel rings are respectively labeled 21 and 22. Such stop-channel rings avoid parasitic triggerings of parasitic MOS transistors due to a voltage on an upper metallization. For example, in FIG. 3, the line connecting metallizations M3 and M4 is in fact a metallization that passes over the silicon oxide that lies over the area comprised between region P1 and the insulating wall 11. If this metallization is at a negative potential with respect to the lower metallization, a P-channel MOS transistor (P11-N-P1) can be turned on and a current can flow through the gate of thyristor P2-N-P1-N1 and turn it on at a voltage lower than the desired voltage defined the Zener diode N4-P7. The stop-channel rings avoid such a drawback.

As is apparent to those skilled in the art, various modifications and additions can be made to the above disclosed preferred embodiments. For example, various conventional structures, such as emitter short-circuit regions, can be conventionally fabricated by those skilled in the art. The described structure can be only a portion of a component that includes, for example, two symmetrical structures identical to the one of FIG. 3. For the distributions and densities of the emitter shorts in regions N1 and N11 the specification of the afore-mentioned application should be referred to.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A monolithic component to protect against overcurrents liable to occur on a line that is series connected to a detection resistor, the component being formed in a substrate of a first conductivity type having an upper surface and a lower surface and comprising:

first and second metallizations, on the upper surface of the substrate, to connect to respective terminals of the detection resistor and a third metallization, on the lower surface of the substrate, to connect to a reference voltage;

a first cathode-gate thyristor and a second anode-gate thyristor head-to-tail connected between the first and third metallizations, the second metallization corresponding to gates of the first and second thyristors; and an avalanche diode between the second and third metallizations, the avalanche diode being connected so that its avalanching causes the first thyristor to be forward conductive;

wherein the second thyristor is one of a gate triggering type and a forward breakover type, a breakover voltage of the second thyristor being substantially equal to an avalanche voltage of the avalanche diode, and wherein the first thyristor is laterally insulated by a diffusion wall of a second conductivity type that completely separates portions of the first and second thyristors that are formed from the substrate.

2. The component of claim 1, wherein the first thyristor and the avalanche diode include:

a first region of the second conductivity type formed in the lower surface of the substrate;

second and third regions of the second conductivity type formed in the upper surface of the substrate;

fourth and fifth regions of the first conductivity type respectively formed in the second and third regions;

a sixth region of the first conductivity type formed at an interface between the third region and the substrate; and the second thyristor includes:

a seventh region of the first conductivity type formed in the lower surface of the substrate;

an eighth region of the second conductivity type formed in the upper surface of the substrate;

a ninth region of the first conductivity type formed in the eighth region;

a tenth region of the second conductivity type formed in the ninth region; and wherein the first metallization contacts an upper surface of the fourth and tenth regions, the second metallization contacts the third and ninth regions, and a fourth metallization connects the second and fifth regions.

3. The component of claim 2, wherein the second thyristor further includes an eleventh contacting region of the first conductivity type formed in the ninth region.

4. The component of claim 3, wherein:

the eighth region is formed simultaneously with the diffusion wall of the upper surface;

the sixth and ninth regions are formed simultaneously; and the second, third, and tenth regions are formed simultaneously.

5. The component of claim 1, further including a stop-channel ring formed at the internal periphery of said diffusion wall.

6. The component of claim 1, wherein the diffusion wall laterally separates the first thyristor from the second thyristor.

7. The component of claim 1, wherein, a cathode of the second thyristor corresponds to the substrate.

8. A monolithic protection component formed in a substrate of a first conductivity type and having an upper surface and a lower surface, the component comprising:

a first metallization formed on the upper surface of the substrate;

a second metallization formed on the lower surface of the substrate;

a first cathode-gate thyristor coupled between the first and second metallizations;

a second anode-gate thyristor coupled between the first and second metallizations, the second thyristor being head-to-tail connected to the first thyristor and having a triggering threshold;

a third metallization formed on the upper surface of the substrate, the third metallization being coupled to gates of the first and second thyristors; and an avalanche diode having an anode that is coupled to the third metallization and a cathode that is coupled to the second metallization, the avalanche diode having an avalanche voltage that is substantially equal to the triggering threshold of the second thyristor;

wherein the first thyristor is laterally insulated from the second thyristor by diffusion walls of a second conductivity type that completely separate portions of the first and second thyristors that are formed from the substrate.

9. The component of claim 8, wherein the second thyristor includes:

a first region of the first conductivity type formed in the lower surface of the substrate, the first region contacting the second metallization;

a second region of the second conductivity type formed in the upper surface of the substrate;

a third region of the first conductivity type formed in the second region; and a fourth region of the second conductivity type formed in the third region, the fourth region contacting the first metallization.

10. The component of claim 9, wherein a doping level of the second region is significantly smaller than a doping level of the diffusion walls.

11. The component of claim 8, wherein the first thyristor and the avalanche diode include:

a first region of the second conductivity type formed in the lower surface of the substrate, the first region contacting the second metallization;

second and third regions of the second conductivity type formed in the upper surface of the substrate, the third region contacting the third metallization;

fourth and fifth regions of the first conductivity type respectively formed in the second and third regions, the fourth region contacting the first metallization; and a sixth region of the first conductivity type formed at an interface between the third region and the substrate;

wherein a fourth metallization connects the second and the fifth regions.

12. The component of claim 11, wherein the second thyristor includes:

a seventh region of the first conductivity type formed in the lower surface of the substrate, the seventh region contacting the second metallization;

a eighth region of the second conductivity type formed in the upper surface of the substrate;

a ninth region of the first conductivity type formed in the eighth region; and a tenth region of the second conductivity type formed in the ninth region, the fourth region contacting the first metallization;

wherein a fourth metallization connects the second and the fifth regions.

13. The component of claim 12, wherein an avalanche voltage of a junction formed between the eighth and ninth regions is substantially equal to an avalanche voltage of a junction formed between the third and sixth regions.

14. The component of claim 12, wherein the second thyristor further includes an eleventh region of the first conductivity type formed in the ninth region and contacting the third metallization.

15. In a monolithic protection component that is formed from a semiconductor substrate having a first conductivity type and includes a first cathode-gate thyristor, a second anode-gate thyristor, and an avalanche diode, the first thyristor being head-to-tail connected to the second thyristor and gates of the first and second thyristors being coupled to an anode of the avalanche diode, a method of increasing a triggering sensitivity of the second thyristor comprising the steps of:

completely separating a first portion of the substrate that is used to form the first thyristor from a second portion of the substrate that is used to form the second thyristor to insulate the second thyristor from the first thyristor and the avalanche diode; and adjusting a triggering threshold of the second thyristor to substantially equal an avalanche voltage of the avalanche diode.

16. The method of claim 15, wherein the step of separating includes:

diffusing, around the first thyristor, a dopant having a second conductivity type into an upper surface of the substrate; and diffusing, around the first thyristor, the dopant into a lower surface of the substrate;

wherein, the second conductivity type is opposite to the first conductivity type and the steps of diffusing form an insulating wall around the first thyristor.

17. The method of claim 16, wherein the second thyristor includes alternating regions of the first and second conductivity types and the step of adjusting includes a step of modifying dopant levels of the alternating regions to adjust the triggering threshold of the second thyristor.

18. The method of claim 16, wherein the second thyristor includes alternating regions of the first and second conductivity types and the step of adjusting includes a step of modifying diffusion patterns of the alternating regions to adjust the triggering threshold of the second thyristor.

\* \* \* \* \*